United States Patent [19]

Mutaguchi et al.

[11] Patent Number: 5,256,234

[45] Date of Patent: Oct. 26, 1993

[54] LAMINATE AND PROCESS FOR PRODUCING IT

[75] Inventors: Yasuhiko Mutaguchi, Otsu; Shinichiro Miyaji, Koka; Yukichi Deguchi, Otsu, all of Japan

[73] Assignee: Toray Industries, Inc., Japan

[21] Appl. No.: 853,099

[22] Filed: Mar. 18, 1992

Related U.S. Application Data

[62] Division of Ser. No. 646,673, Jan. 28, 1991, Pat. No. 5,130,181.

[30] Foreign Application Priority Data

Feb. 2, 1990 [JP] Japan .................................. 2-24765

[51] Int. Cl.$^5$ .............................................. B29C 47/00
[52] U.S. Cl. .............................. 156/244.27; 156/229; 156/308.2; 156/312; 428/419
[58] Field of Search ............... 156/244.27, 308.2, 312, 156/229; 428/419, 212, 910, 213

[56] References Cited

U.S. PATENT DOCUMENTS

| | | | |
|---|---|---|---|
| 3,783,067 | 1/1974 | Petzetakis | 156/229 |
| 4,707,402 | 11/1987 | Thorsrud | 428/419 |
| 5,069,962 | 12/1991 | Okazaki et al. | 428/213 |

*Primary Examiner*—John J. Gallagher
*Attorney, Agent, or Firm*—Austin R. Miller

[57] ABSTRACT

A laminate comprising a non-oriented polyphenylenesulfide film and a biaxially oriented polyphenylenesulfide film bonded on at least one surface of the non-oriented polyphenylenesulfide film without using an adhesive, and process for producing it. The delamination of the laminate can be prevented and the tear strength can be increased by suppressing the crystallization of the non-oriented polyphenylenesulfide film. Since an adhesive is not interposed and the main component of the layers of the laminate is polyphenylenesulfide, the laminate can have excellent heat resistance, chemical resistance, electrical insulating property, wet heat resistance and processability with a good balance.

9 Claims, No Drawings

LAMINATE AND PROCESS FOR PRODUCING IT

This application is a divisional of application Ser. No. 07/646,673, filed Jan. 28, 1991, now U.S. Pat. No. 5,130,181.

BACKGROUND OF THE INVENTION

1. Field of the Invention

The present invention relates to a laminate and a process for producing it, and more specifically relates to a laminate which comprises a non-oriented polyphenylenesulfide film and a biaxially oriented polyphenylenesulfide film whose main components are polyphenylenesulfide (hereinafter, this term is also referred to as "PPS").

2 Description of the Prior Art

Electrical insulating materials, having various properties such as heat resistance (particularly, long-term heat resistance under a high-temperature condition), electrical properties, mechanical properties (particularly, impact resistance) and flame resistance with a good balance and further having an excellent processability (particularly, a high tear strength capable of preventing a material from being broken), have been required accompanying with miniaturization and elevation of efficiencies of electrical equipments or parts for vehicles.

For example, the following materials are known as the conventional electrical insulating materials used in such technical fields.

(1) a biaxially oriented PPS film disclosed in, for example, Japanese Patent Laid-Open SHO 55-35459

(2) non-oriented PPS sheets disclosed in, for example, Japanese Patent Laid-Opens SHO 56-34426 and 57-121052

On the other hand, laminated films and laminates such as the following ones are also known.

(3) a laminate formed by laminating biaxially oriented PPS films to each other via an adhesive disclosed in, for example, Japanese Patent Laid-Open SHO 61-241142 (it is also known that biaxially oriented PPS films are heat stacked to each other by surface treatment such as corona discharge treatment or plasma treatment.)

(4) a laminate formed by laminating a biaxially oriented PPS film and a biaxially oriented polyester film disclosed in, for example, Japanese Patent Laid-Open SHO 62-292431

(5) a laminate formed by laminating a biaxially oriented PPS film and a fibrous sheet composed of an aromatic polymer disclosed in, for example, Japanese Patent Laid-Open SHO 60-63158

(6) a laminate formed by laminating a biaxially oriented PPS film and an ethylene tetrafluoride-propylene hexafluoride copolymer filmdisclosed in, for example, Japanese Patent Laid-Open SHO 62-292432

(7) a laminate formed by laminating a biaxially oriented PPS film and an injection molded PPS plate disclosed in, for example, Japanese Patent Laid-Open HEI 1-192547

However, such conventional film, sheets and laminates have the following problems.

The film of the above (1) has a poor impact resistance and a poor tear strength. Therefore, for example, when the film is used as a slot liner or a wedge of a motor, the film is easily torn or delaminated.

Although the non-oriented sheet of the above (2) has a high tear strength, it has a low tensile elongation. Moreover, when the sheet is exposed in a high-temperature condition near its melting point, its mechanical properties are rapidly decreased and its stability in shape is remarkably deteriorated because the sheet has a poor long-term heat resistance. Therefore, it is difficult to use the sheet as an electrical insulating material by itself.

The laminate of the above (3) has higher impact resistance and tear strength as compared with the film of the above (1), but it is not sufficient. Moreover, since an adhesive interposes between the laminated films, it is liable to occur that the excellent properties of the biaxially oriented PPS films such as heat resistance and chemical resistance are decreased. In the laminate wherein biaxially oriented PPS films are heat stacked to each other, the adhesive property of the laminate is poor and the laminate is easily delaminated by applying an impact force.

In the laminate of the above (4), since the heat resistance, chemical resistance and wet heat resistance of the biaxially oriented polyester film, which constitutes a main layer, are poor, the excellent properties of the biaxially oriented PPS film cannot be realized, and there is a limit for use of the laminate.

Although the laminate of the above (5) has a high impact resistance, because lamination is performed via an adhesive and the adhesive cannot have high heat resistance and chemical resistance, the properties of the laminate are decreased as a whole. Moreover, since the hygroscopic property of of the fibrous sheet of the laminate is very high, the dimensional change under a wet heat condition of the laminate is large. Furthermore, the fibrous sheet of the laminate gets loose and chips are generated, when the laminate is processed in, for example, slitting process. Therefore, this laminate is restricted in use for an insulating material of an electrical equipment which requires a high accuracy, for example, a hermetic motor for a refrigerator.

In the laminate of the above (6), the laminate has high heat resistance and chemical resistance, and because the films are laminated without using an adhesive, there is not a fear that an adhesive give a bad influence to the laminate. However, various surface treatments for the films are required to make the laminate. In addition, since the adhesive force at the laminated surfaces in the laminate is weak, the films are easily delaminated and the biaxially oriented PPS film is easily torn when an impact force is applied to a part of the laminate.

In the laminate of the above (7), as the injection molded PPS plate is crystallized, there is a problem similar to that in the film of the above (1).

On the other hand, it has been required more and more to increase the impact resistance and tear strength of a laminate while maintaining the excellent properties of biaxially oriented PPS film.

SUMMARY OF THE INVENTION

Accordingly, an object of the present invention is to provide a laminate composed of only PPS which has the excellent properties of PPS such as heat resistance, chemical resistance, electrical insulating property, flame resistance, wet heat resistance and processability with a good balance and particularly has excellent adhesive property between layers and tear strength, and a process for producing it.

To achieve this object, a laminate according to the present invention comprises an A layer consisting of a non-oriented polyphenylenesulfide film and a B layer consisting of a biaxially oriented polyphenylenesulfide film bonded on at least one surface of the A layer without using an adhesive. The residual crystallization heat of the A layer is not less than 20% of the crystallization heat of a resin composing the A layer. The B layer substantially does not have an exothermic peak due to crystallization in the range of 20° C. to 180° C.

In the present invention, "polyphenylenesulfide (PPS)" means a polymer in which not less than 70 mol % (preferably not less than 85 mol %) of the recurring unit is a unit shown by a constitutional formula

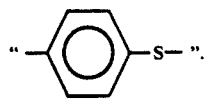

If such a component is less than 70 mol %, the crystallization property and heat transition temperature of the polymer are decreased, the heat resistance, dimensional stability and mechanical properties of the film formed from the resin, whose main component is PPS, are injured. A unit containing a sulfide linkage capable of copolymerizing may be contained as long as the content of the unit is less than 30 mol %, preferably less than 15 mol %. The copolymerization of the polymer may be any of random type and block type.

In the present invention, "non-oriented polyphenylenesulfide film (hereinafter, this term is also referred to as "PPS-NO")" means a film, sheet or plate whose thickness is not greater than 1 mm, which is melt formed from a resin composition material containing polyphenylenesulfide by not less than 60 wt % and which is substantially non-oriented. If the content of PPS is less than 60 wt %, the mechanical properties such as tear strength and the heat resistance of the PPS-NO are decreased. The remaining part of less than 40 wt % of the resin composition material can include a polymer other than PPS and an additive such as an inorganic or organic filler, lubricant or colorant. The melt viscosity of the resin composition material is preferably in the range of 700 to 20,000 poise under a condition of a temperature of 300° C. and a shear rate of 200 sec$^{-1}$, from the viewpoint of formation of a sheet.

In the present invention, "biaxially oriented polyphenylenesulfide film (hereinafter, this term is also referred to as "PPS-BO")" means a film which is formed by melt forming a resin composition material containing polyphenylenesulfide by not less than 90 wt % in the form of a sheet, stretching the sheet biaxially and heat treating the biaxially stretched film. If the content of PPS is less than 90 wt %, the crystallization property and heat transition temperature of the resin composition material are decreased, the heat resistance, dimensional stability and mechanical properties, which are characteristics of the film formed from the resin composition material, are injured. The remaining part of less than 10 wt % of the resin composition material can include a polymer other than PPS and an additive such as an inorganic or organic filler, lubricant, colorant or ultraviolet absorbent. The melt viscosity of the resin composition material is preferably in the range of 500 to 12,000 poise (more preferably in the range of 700 to 10,000 poise) under a condition of a temperature of 300° C. and a shear rate of 200 sec$^{-1}$, from the viewpoint of formation of a film. The melt viscosity of the resin composition material is substantially equal to the melt viscosity of the PPS-BO obtained finally. The thickness of the film is preferably in the range of 3 μm to 300 μm.

The laminate according to the present invention is made by laminating a PPS-NO and a PPS-BO without using an adhesive. Prior to the lamination, a heat treatment or oxidation crosslinkage is applied to the PPS-NO. Further, corona discharge treatment or plasma treatment may be performed on the surfaces of the PPS-NO and/or PPS-BO in the present invention.

In the laminate according to the present invention, the residual crystallization heat of the A layer "$\Delta Ht(A)$" is the crystallization heat of the PPS-NO of the laminate, i.e., the laminate whose necessary steps for making the laminate are completed. This residual crystallization heat of the A layer "$\Delta Ht(A)$" can be determined from the exothermic peak area. The exothermic Peak of crystallization, which presents when the layer is heated, can be determined by a differential scanning calorimeter (hereinafter, referred to as "DSC"). In the Present invention, the PPS-NO is separated from the PPS-BO by cutting away the PPS-BO from the laminate by, for example, a microtome observing the section of the laminate by a microscope, and the exothermic peak presented when the PPS-NO is heated from 20° C. to 180° C. in an inert gas atmosphere can be determined by DSC.

The crystallization heat of a resin composing the A layer "$\Delta Hg(A)$" can be determined from the exothermic peak area of crystallization, which presents when a sample is heated by DSC after the PPS-NO of the laminate is heated to a temperature higher than the melting point by DSC and the molten material is rapidly cooled in a cooling medium such as liquid nitrogen to make the sample. In the present invention, the value calculated from the equation of $\Delta Ht(A)/\Delta Hg(A) \times 100$ is necessary to be not less than 20% (preferably in the range of 40 to 100%), to achieve increase of tear strength and improvement of processability which are the objects of the present invention. If the above value is less than 20%, because the characteristics of the PPS-NO deteriorate by crystallization and the adhesive force of the lamination surface between the PPS-NO and the PPS-BO becomes weak, delamination or cleavage is liable to occur in the laminate when an impact force is applied to the laminate.

The B layer of PPS-BO of the laminate according to the present invention can be taken out, observing the laminate by, for example, a microtome. In the present invention, it is necessary that the PPS-BO does not have an exothermic peak due to crystallization in the range of 20° C. to 180° C. when the PPS-BO is heated and determined by DSC in order to obtain desired processability, handling ability for lamination, stability in shape, mechanical properties and heat resistance for a high-temperature condition.

With respect to the thickness ratio of the films constituting the laminate according to the present invention, when the thickness of the PPS-NO is referred to as [A] and the thickness of the PPS-BO is referred to as [B], the thickness ratio of a two-layer laminate, which is a first embodiment of the present invention, is preferably in the range of $0.2 \leq B/A \leq 5.0$, more preferably in the range of $0.3 \leq B/A \leq 3.0$, from the viewpoints of the balance of heat resistance, stability in shape and impact resistance when the laminate is heated and suppression of crystallization when the films are laminated. The total thickness of the laminate is preferably in the range of 20 to 700 μm. If the total thickness of the laminate is less than 20 μm, it is difficult to ensure the flatness of the laminate and maintain the mechanical properties of the laminate. If the total thickness of the laminate is more than 700 μm, it is difficult to control the crystallization of the PPS-NO in the lamination process described later. The thickness ratio and the thickness of the layers are determined by observing the section of the laminate by a microscope.

In a three-layer laminate which is a second embodiment of the present invention (PPS-BO/PPS-NO/PPS-BO), when the thicknesses of the respective layers are referred to as [B], [A] and [B'], the thickness ratio of the laminate is preferably in the range of $0.2 \leq (B+B') \leq 5.0$, more preferably in the range of $0.3 \leq (B+B') \leq 3.0$, from the viewpoints of the balance of heat resistance, stability in shape and impact resistance when the laminate is heated and suppression of crystallization when the films are laminated. The thickness ratio of B and B' (B/B') is preferably in the range of 0.5 to 2.0 from the viewpoint of handling ability when the laminate is processed. The total thickness of the laminate is preferably in the range of 30 to 1,000 μm.

The density of the PPS-NO of the laminate according to the present invention is preferably not greater than 1.346, more preferably in the range of 1.320 to 1.344, as a density determined by the usual method using a density gradient tube, from the viewpoint of the balance of adhesive property and tear strength. If the density is greater than 1.346, the mechanical properties of the PPS-NO as well as its adhesive property and tear strength are decreased by its crystallization. The density of the PPS-NO layer of the laminate can be determined by cutting away the PPS-BO surface layer from the laminate observing the section of the laminate by a microscope, and measuring the density of the obtained film by the above density gradient tube method.

The laminate according to the present invention is made by bonding PPS-NO and PPS-BO without using an adhesive by thermocompression bonding. Among the above typical two embodiments, the three-layer laminate is more preferable from the viewpoints of long-term heat resistance under a high-temperature condition, stability in shape, impact resistance and chemical resistance.

The process for producing the laminate according to the present invention will be explained.

Firstly, the processes for producing PPS, PPS-NO and PPS-BO will be explained.

PPS used in the present invention is obtained by reacting alkali sulfide and paradihalobenzene in a polar solvent under a high-temperature and high-pressure condition. Particularly, the PPS is preferably made by reacting sodium sulfide and paradichlorobenzene in an amide polar solvent having a high boiling point such as N-methylpyrolidone. In the reaction, it is most preferable to react them under a temperature condition of 230° to 280° C. adding so-called polymerization modifier such as caustic alkali or calboxylic acid type alkali salt in order to control the degree of polymerization. The pressure in the polymerization system and the polymerization time are appropriately decided in accordance with the kind and amount of the modifier used and the desired degree of polymerization. The powdery or particled polymer obtained is separated from byproduct salt, polymerization modifier and non-reacted monomer etc., by washing with water or/and a solvent.

To form this polymer as the PPS-NO according to the present invention, the polymer is supplied to a melt extruder, the polymer is heated to a temperature higher than the melting point (preferably in the range of 300° to 350° C.) and sufficiently molten and kneaded, and thereafter, the molten polymer is continuously delivered out from a die having a slit in the form of a sheet and rapidly cooled to a temperature of not higher than the glass transition temperature of the sheet. In the present invention, PPS-NO, whose exothermic peak determined by DSC when the film is heated from 20° to 180° C. in an inert gas atmosphere (crystallization temperature "Tcc") is not less than 125° C. (preferably in the range of 130° to 160° C.), is preferable as the PPS-NO used for the laminate according to the present invention, from the viewpoint of the fact that the film is difficult to be crystallized when the laminate is heated, and the processability of the film and the laminate. The PPS-NO having such a property can be obtained by the above process including the rapid cooling. If the temperature of the extrusion is too low, the degree of the kneading is insufficient or the cooling is too slow, crystallization may occur in the PPS-NO, and this is not preferable. If the temperature of the extrusion is too high, a trouble such as foaming on the sheet due to heat decomposition is liable to occur.

The PPS-BO according to the present invention can be obtained by biaxially stretching the PPS-NO obtained by the above process and heat treating it in a known manner. Preferably, the stretching is performed under a condition of a temperature in the range of 90° to 110° C. and a stretching ratio in the range of 3.0 to 4.5 times in both of the longitudinal and transverse directions, and the heat treatment is performed under a condition of a temperature in the range of 180° C. to the melting point and a restricted shrinkage of constant length or not greater than 15% for a time in the range of 1 to 60 seconds, from the viewpoint of heat resistance, mechanical properties and thermally dimensional stability. Further, the film may be relaxed in one or two directions in order to increase the thermally dimensional stability. The PPS-BO used for the laminate must be a biaxially oriented film which substantially does not have an exothermic peak due to crystallization determined by DSC when the film is heated from 20° C. to 180° C. in an inert gas atmosphere at the rate of 20° C./min (i.e., completely crystallized). If a PPS-BO which is not heat treated or a PPS-BO which is not sufficiently heat treated is used for the laminate, there occurs a problem that the heated film adheres to a roll because of its poor heat resistance or a problem that wrinkles occur on the laminate because of its poor stability in shape. The degree of crystallization of the PPS-BO (B layer) of the laminate after the film is laminated can be determined by, for example, taking out the PPS-BO from the laminate using a microtome etc. observing the section of the laminate by a microscope, and determining the obtained sample by DSC.

Next, the lamination process according to the present invention will be explained.

There are the following processes as the lamination processes of a two-layer laminate.

(I) There is a process comprising the steps of: laminating the PPS-NO and PPS-BO obtained by the aforementioned processes; bonding the laminated films by thermocompression bonding under a condition of a temperature in the range of 180° to 270° C. and a pressure in the range of 1 to 20 kg/cm²; and cooling the bonded films to a temperature of not higher than the crystallization temperature of the PPS-NO within 60 seconds (preferably to a temperature of not higher than 80° C.) via a cooling metal roll or fresh air in order to prevent the crystallization of the PPS-NO layer of the laminate. The cooling is conducted preferably by air to ensure the flatness of the laminate. Of course, the cooling metal roll and fresh air may be both applied for the cooling. Particularly, in this cooling the laminated and bonded films must be rapidly cooled to a temperature of not higher than the crystallization temperature of the PPS-NO to obtain a desired laminate. In the laminating step, if the lamination speed is too high, bubbles or wrinkles are likely to be generated, or the cooling of the laminate is late and the crystallization of the PPS-NO is liable to occur, and therefore, the degree of the residual crystallization is decreased and mechanical properties such as tear strength are decreased. If the lamination speed is too low, the productivity of the laminate decreases. In the bonding step, if the temperature is lower than 180° C., the adhesive property between the films is poor, and the laminate obtained is easily delaminated by applying an impact. If the temperature is higher than 270° C., the flatness of the laminate rapidly deteriorates and the thickness of the laminate is difficult to be controlled. With respect to the pressure in the thermocompression bonding, if the pressure is lower than 1 kg/cm$^2$, only a poor adhesive property can be obtained even if the temperature is high. If the pressure is higher than 20 kg/cm$^2$, the flatness of the laminate rapidly deteriorates and the PPS-NO is likely to break.

In the lamination, methods such as roll pressing and heated plate pressing can be employed. Roll pressing method is more preferable from the viewpoint of easy control of the crystallization of the PPS-NO.

(II) There is another process wherein the PPS-NO and PPS-BO obtained by the aforementioned processes are laminated and the laminated films are heat fixed in advance under a condition of a temperature in the range of 80° to 130° C. and a pressure in the range of 1 to 20 kg/cm$^2$ (the first stage lamination process), and thereafter, the laminated films are further bonded and cooled by the process described in the above (I). In the first stage lamination process, if the temperature is lower than 80° C., the adhesive property is too low, and the laminated films are likely to delaminate or bubbles or wrinkles are liable to occur between the two layers in the succeeding process described in the above (I). If the temperature is higher than 130° C., the crystallization of the PPS-NO is accelerated and the mechanical properties of the laminate such as tear strength, which is obtained through the succeeding process described in the above (I), are decreased. If the pressure in the first stage lamination process is lower than 1 kg/cm$^2$, only a poor adhesive property can be obtained in the range of the temperature of the first stage lamination process. If the pressure is higher than 20 kg/cm$^2$, the thickness control of the laminate is difficult because the PPS-NO of the laminate is roughened, or the flatness of the laminate deteriorates because there occurs a large curl or wave in the laminate. The succeeding process is like one as described in the above (I).

(III) There is a further process wherein PPS is supplied to an extruder and rendered molten in the extruder, the molten PPS is delivered out from a die having a slit in the form of a sheet and the sheet is laminated on the PPS-BO which is positioned below the die and integrated with the PPS-BO (the first stage lamination process), and thereafter, the laminated films are further bonded and cooled by the process described in the above (I). If only the above first stage lamination process is employed, although a very good flatness can be obtained, there is a problem that PPS-NO and PPS-BO are easily delaminated in a high-temperature condition. If the temperature condition is out of the range of the process (I), there occur the problems similar to those described in the above (I).

Next, the lamination processes for a three-layer laminate will be explained.

(IV) There is a process wherein another PPS-BO is laminated on the PPS-NO side of the two-layer laminate obtained by the lamination process described in (I), and the laminated PPS-BO and the two-layer laminate are bonded and cooled by the process described in (I) to make a three-layer laminate.

(V) There is another process wherein PPS-BO, PPS-NO and PPS-BO are laminated in this order and bonded and cooled by the process described in (I).

In the above processes of (IV) and (V), if the lamination and cooling conditions are out of the range of process (I), there occur the problems similar to those described in (I).

(VI) There is a further process wherein another PPS-BO is laminated on the PPS-NO side of the two-layer laminate obtained in the first stage lamination process of the process described in (II), and the laminated PPS-BO and the two-layer laminate are bonded and cooled by the process described in (I) to make a three-layer laminate.

(VII) There is a still further process wherein wherein PPS-BO, PPS-NO and PPS-BO are laminated in this order, firstly the laminated films are heat fixed under the condition of the first stage lamination process of the process described in (II) and thereafter, bonded and cooled by the process described in (I).

In the above processes of (VI) and (VII), if the conditions of the first stage lamination processes and the succeeding the process (I) are out of the aforementioned ranges, there occur the problems similar to those described in (I) and (II).

(VIII) There is a still further process wherein wherein another PPS-BO is laminated on the PPS-NO side of the two-layer laminate obtained in the first stage lamination process of the process described in (III), and the laminated PPS-BO and the two-layer laminate are bonded and cooled by the process described in (I).

(IX) There is a still further process wherein wherein PPS is melt excluded and laminated between two layers of PPS-BO by the process described in (III), and integrated with the two layers (the first stage lamination process), and thereafter, the formed three-layer laminate is heat bonded and cooled by the process described in (I).

In the above processes of (VIII) and (IX), if the conditions and cooling process are out of the aforementioned ranges and process condition, there occur the problems similar to those described in (I).

In the laminate according to the present invention, since the thickness ratio of the laminate is controlled and the crystallization of PPS-NO is controlled to be suppressed as described hereinabove, the laminate can have excellent characteristics such as excellent heat resistance (particularly, long-term heat resistance and short-term heat resistance under a high-temperature condition), wet heat resistance, impact resistance and flame resistance with a good balance. Particularly, the laminate can have excellent adhesive property and tear strength by suppressing the crystallization of PPS-NO layer. Moreover, since an adhesive is not interposed in the laminate according to the present invention, there is no fear that the deterioration of an adhesive decreases the characteristics of the laminate. Furthermore, the laminate according to the present invention also can have an extremely excellent processability for processing to various forms in comparison with the conventional PPS-BO.

The laminate according to the present invention is suitable to use for insulating materials used in a motor, transformer, etc. which require a high heat resistance and wet heat resistance (for example, wedge, slot and wrapping insulating material). For example, the laminate according to the present invention can be used for the various parts used in various motors such as a hermetic motor which is dipped into a refrigerating machine oil, a servomotor and a motor for vehicles, a core insulating material for a motor such as a stepping motor and a servomotor in which coils are wound directly on a core (this is a formed insulating material utilizing the excellent processability and easy formation property of the laminate according to the present invention), the parts for various transformers such as a gas transformer, an oil transformer and a mold transformer, and the insulating parts for generators.

Further, since the laminate according to the present invention also has an excellent radiation resistance and low-temperature property, the laminate is also suitable to electrical insulating materials used for the apparatuses in, for example, electric power plants which require a radiation resistance and covering materials for superconductors.

Furthermore, the laminate according to the present invention is also suitable to wrapping materials for cables, circuit boards, face exothermic bodies, diaphragms, sound diaphragms, belts, interior materials, mold releasing materials for ceramics and resins, and substrates for transfer printing of circuits. Still further, the laminate according to the present invention is also suitable to insulating sheets used between conductors such as between circuit boards and between a circuit and a metal, and sliding materials used in office automation equipments which are made by punching or forming (for example, gears and washers).

The laminate according to the present invention may be punched and formed as described above, and further, may be laminated with another film or sheet or a fibrous sheet or metal having a heat resistance, or other resins may be coated or molded on the laminate.

Next, the methods for determining the characteristics and the criteria for estimating the characteristics used in the description of the present invention will be explained.

(1) Residual Crystallization Heat ($\Delta Ht(A)$)

The exothermic peak area of the crystallization temperature, presented when the PPS-NO obtained by cutting the laminate in its thickness direction or removing the surface layer of the laminate is heated from 20° C. to 180° C. by a differential scanning calorimeter (DSC-2 type; produced by Perkin Elmer corporation) in an inert gas atmosphere under the following conditions, is determined by calculation method (half width × height, base × height/2) or weight method, the value determined from the peak area of indium which is a primary standard and a constant "K" are calculated, and the residual crystallization heat "$\Delta Ht(A)$" (unit: cal/g) of the laminate is calculated by the following equation.

Conditions of determination:
  Weight of sample; 5 mg (laminate)
  Range; 5 m cal/sec.m
  Chart speed; 40 mm/sec
  Rate of temperature elevation; 20° C./min $$\Delta Ht(A) = \frac{K \times \text{range} \times \text{peak area (cm}^2\text{)}}{\text{weight of sample} \times \text{chart speed (cm/sec)}}$$

(2) Crystallization Heat ($\Delta Hg(A)$)

The PPS-NO part of the laminate is sampled and the sample is molten by heating it from 20° C. to 340° C. in an inert gas atmosphere by DSC. Thereafter, the molten sample is rapidly cooled by a cooling medium such as liquid nitrogen to obtain a non-oriented sample. The crystallization heat "$\Delta Hg(A)$" of the sample obtained is determined using DSC again, under the same conditions as those used when $\Delta Ht(A)$ is determined.

(3) Crystallization Temperature (Tcc)

The crystallization temperature "Tcc" is represented as a peak value of the crystallization temperature presented when the sample film is elevated from 20° C. to 180° C. by a differential scanning calorimeter (DSC-2 type; produced by Perkin Elmer corporation) under the following conditions.

Conditions of determination:
  Weight of sample; 5 mg
  Range; 5 m cal/sec.m
  Chart speed; 40 mm/sec
  Rate of temperature elevation; 20° C./min (4) Density The sample film is cut to a small sample with an appropriate size, the sample is introduced into a density gradient tube made by utilizing the density difference of lithium boromide solution, and the density at the point where the sample stays is determined as the density of the film.

(5) Heat Resistance

The initial tensile strength of the sample film and the tensile strength of the film after the film is aged in a oven heated at 180° C. for 2,000 hours are determined by the method defined in ASTM-D-638-72. In a case where the strength after aging is not less than 70% of the initial strength before aging, the heat resistance is determined as "○", in a case where the strength after aging is in the range of 10 to 70% of the initial strength, the heat resistance is determined as "Δ", and in a case where the strength after aging is less than 10% of the initial strength, the heat resistance is determined as "X".

(6) Tear Strength

The tear strength is determined in accordance with the method of JIS-P8116-1960, and the unit is "g/mm".

(7) Impact Resistance

The sample is cut at the width of 20 mm and the length of 100 mm, the sample is looped in its longitudinal direction, the bottom edge in the width direction of the sample is fixed, a weight is fallen from the position above the top edge of the sample where is distanced by 20 cm from the top edge of the sample, and the damage due to the fallen weight is observed and determined as the impact resistance of the sample as follows.
○: There is no damage of the sample.
Δ: A part of the top edge of the sample is torn.
X: The top edge of the sample is greatly delaminated or greatly torn.

(8) Heat Resistance For High Temperature

The sample with the width of 10 mm and the length of 50 mm is floated in a solder for 10 seconds, and thereafter, the sample is stretched from both edges by a tweezers, and the heat resistance for high temperature of the sample is estimated by the following criteria.
○: The sample does not extend even if it is stretched.
Δ: The sample slightly extends when it is stretched.
X: The sample greatly extends or breaks when it is stretched.

(9) Wet Heat Resistance

The sample is deposited into an autoclave with a capacity of 200 cc, the autoclave is closed after a small amount of water is introduced into it. The tensile elongation after aging for 100 hours is determined according to the method of ASTM-D-638-72, and in a case where the elongation after aging is not less than 70% of the initial value before aging, the wet heat resistance is determined as "○", in a case where the elongation after aging is in the range of 10 to 70% of the initial value, the wet heat resistance is determined as "Δ", and in a case where the elongation after aging is less than 10% value, the wet heat resistance is determined as "X".

(10) Flame Resistance

The sample is cut at a width of 20 mm, the tip of the cut sample is exposed in a flame, and the combustion state of the sample when the sample is moved away from the flame is estimated by the following criteria.
○: The fire of the sample immediately goes out.
Δ: The fire of the sample goes out after a while.
X: The fire of the sample does not go out.

(11) Adhesive Force

The sample is delaminated at an angle of 90 degrees using a schopper. The width of the sample is 10 mm and the delamination speed is 200 mm/min.

(12) Elongation at Break

It is determined according to the method of ASTM-D-638-72.

DETAILED DESCRIPTION OF PREFERRED EMBODIMENTS OF THE INVENTION

Next, the present invention will be explained in more detail by examples. However, the present invention is not restricted by the examples.

EXAMPLE 1

(1) Preparation of Non-oriented Polyphenylenesulfide Film (PPS-NO)

Sodium sulfide of 32.6 kg (250 mol, containing crystallization water at a content of 40 wt %), sodium hydroxide of 100 g, sodium benzoate of 36.1 kg (250 mol) and N-methyl-2-pyrolidone (hereinafter, referred to as "NMP") of 79.2 kg were charged in an autoclave and dehydrated at 205° C. Thereafter, 1.4-dichlorobenzen of 37.5 kg (255 mol) and NMP of 20.0 kg were added to them, and the mixture was reacted at 265° C. for four hours. The reaction product was washed by water and dried, and polyphenylenesulfide of 21.1 kg (yield : 78%), which was composed of p-phenylenesulfide unit of 100 mol % and had a melt viscosity of 3,100 poise, was obtained.

Fine silica particles of 0.1 wt % which have a mean particle diameter of 0.7 μm and calcium stearate of 0.05 wt % were added to this composition material, the composition material was molten at 310° C. by an extruder having a diameter of 40 mm and filtrated by a filter of 95% cut using metal fibers and having a porous diameter of 10 μm, and thereafter, the molten composition material was delivered out from a T-die having linear lips whose length was 400 mm and the gap of which was 0.5 mm. The delivered material was cast onto a metal drum, whose surface was maintained at 25° C., to be rapidly cooled, and whereby a non-oriented polyphenylenesulfide film having a thickness of 100 μm and a crystallization temperature of 140° C. was obtained. (This film is referred to as "PPS-NO-1".)

(2) Preparation of Biaxially Oriented Polyphenylenesulfide Film (PPS-NO )

PPS-BOs of "Torelina" type 3030 produced by Toray Industries, Inc. having thicknesses of 50 μm and 100 μm are used. Any of the PPS-BOs did not have exothermic peak due to crystallization. (These films are referred to as "PPS-BO-1 and PPS-BO-2".)

(3) Production of Laminate

PPS-NO-1 and PPS-BO-2 were laminated while they were fed from different unwinders, the laminated films were bonded by thermocompression bonding, using press rolls under a condition of a temperature of 240° C. and a pressure of 10 kg/cm$^2$, and thereafter, the laminate was cooled by fresh air blown from slit nozzles to both of upper and lower surfaces of the laminate over the entire width of the laminate, controlling the amount of the air in order to decrease the temperature of the laminate to a temperature of not higher than 80° C. within 30 seconds after the thermocompression bonding. The temperature of the laminate was determined by the radiation thermometer (IR0510; produced by Minolta Camera Corporation). The obtained laminate is referred to as "laminate-1".

EXAMPLE 2

PPS-NO-1 used in Example 1 and PPS-BO-1 prepared in Example 1 were laminated in the form of three layer in the order of PPS-BO-1/PPS-NO-1/PPS-BO-1 and heat bonded under the condition of Example 1, and thereafter, the laminate was cooled under the condition of Example 1. The obtained laminate is referred to as "laminate-2".

COMPARATIVE EXAMPLE 1

PPS-NO having a thickness of 150 μm was made under the condition of Example 1. Further, The PPS-NO was heat treated by rolls at a temperature of 240° C. for five seconds (PPS-NO-2).

COMPARATIVE EXAMPLE 2

PPS-NO having a thickness of 2.5 mm was formed by the process of Example 1 under the condition of adjusting the gap of the linear lips of the T-die to 1. 5 mm. The PPS-NO was stretched in the transverse direction by a stretching apparatus comprising rolls at a stretching ratio of 3.9 times under the condition of a temperature of 98° C. and a stretching speed of 30,000%/min, and thereafter, the film was stretched in the longitudinal direction by a tenter at a stretching ratio of 3.5 times under the condition of a temperature of 100° C. and a stretching speed of 1,000%/min and heat treated in a heat treatment room of the tenter at a temperature of 270° C. for 10 seconds to make a PPS-BO having a thickness of 150 μm (PPS-BO-3).

COMPARATIVE EXAMPLE 3

As the production conditions of PPS-NO of Example 1, the melt temperature of PPS was changed to 290° C. and the cast film delivered out from the T-die was gradually cooled. Other conditions were the same as those of Example 1. As a result, a PPS-NO having a thickness of 100 μm and a crystallization temperature of 120° C. was obtained (PPS-NO-3).

PPS-BO-2 of Example 1 and the above PPS-NO-3 were laminated and heat bonded under the condition of Example 1, and thereafter, the laminate was cooled under the condition of Example 1. The obtained laminate is referred to as "laminate-3".

COMPARATIVE EXAMPLE 4

PPS-BO-1 of Example 1 and PPS-NO-3 obtained in Comparative Example 3 were laminated to a three-layer laminate having the lamination structure of Example 2 and the laminate was heat bonded and cooled under the condition of Comparative Example 3. The obtained laminate is referred to as "laminate-4".

COMPARATIVE EXAMPLE 5

PPS-BO-1 and PPS-NO-1 of Example 1 were laminated to a three-layer laminate having the lamination structure of Example 2, and the laminate was heat bonded under the condition of Example 1 and thereafter naturally cooled without cooling by fresh air. Thereafter, the cooled laminate was wound via cooling rolls. The obtained laminate is referred to as "laminate-5". The temperature of the film at the time that 60 seconds expired from the start of the natural cooling was 150° C. The crystallization temperature of PPS-NO-1 used was 140° C.

COMPARATIVE EXAMPLE 6

PPS-BO-2 of Example 1 and PPS-NO-3 were laminated to a three-layer laminate having the lamination structure of Example 2, and the laminate was heat bonded under the condition of Comparative Example 5 and thereafter cooled in the same manner as that of Comparative Example 5. The obtained laminate is referred to as "laminate-6".

Estimation

The results of estimation of the samples obtained in Examples 1 and 2 and Comparative Examples 1 to 6 are shown in Tables 1-1 and 1-2.

In the laminates according to the present invention, it is understood that tear strength, which was a problem in the conventional laminates, is remarkably improved without decreasing the characteristics of the PPS-BO such as heat resistance, wet heat resistance and flame resistance. Further, the heat resistance for a high temperature condition and elongation at break which were the problems of PPS-NO are improved. If a PPS-NO with a low crystallization temperature (Tcc) is used or the rate of the residual crystallization heat of a laminate, PPS-NO is likely to be crystallized and the adhesive property and tear strength of the laminate are likely to decrease.

Furthermore, in the present invention, there is a merit that, by recognizing the crystallization temperature (Tcc) of PPS-NO and the rate of the residual crystallization heat of a laminate, those can be utilized as the parameters of the characteristics of the laminate.

EXAMPLE 3

PPS polymer used in Example 1 was molten at 310° C. by an extruder having a diameter of 30 mm and delivered out from a T-die having linear lips whose length was 240 mm and the gap of which was 1.0 mm. Press rolls, whose surface temperature was maintained at 90° C., were provided below the T-die, and the delivered polymer was continuously laminated on PPS-BO-2 used in Example 1 while the film is pressed at a speed of 1 m/min so that the lamination thickness of the delivered polymer became 200 μm. Thereafter, the laminate was heat bonded under the condition of Example 1 and cooled in the same manner as that of Example 1. The obtained laminate is referred to as "laminate-7". In the above, the distance between the T-die and the PPS-BO to be laminated was 20 mm and the pressure of the press rolls was 5 kg/cm².

EXAMPLE 4

PPS polymer was delivered between two layers of PPS-BO-1 in the same manner as that of Example 3, and a three-layer laminate having a lamination structure of PPS-BO/PPS-NO/PPS-BO was made. The conditions of lamination and cooling were the same as those of Example 3. The obtained laminate is referred to as "laminate-8".

Estimation

As the result of estimation of laminate-7 and laminate-8 obtained in Examples 3 and 4, they presented the characteristics similar to those of laminate-1 and laminate-2 as shown in Tables 1-1 and 1-2. Accordingly, the object of the present invention is achieved.

TABLE 1-1

| | Structure of Lamination B/A/B' (μ) | Thickness ratio (B+B')/A | PPS-NO crystallization temperature Tcc (°C.) | Rate of Residual crystallization heat (%) | PPS-NO Density (ρ) | Elongation at break (%) | Sample |
|---|---|---|---|---|---|---|---|
| Exam. 1 | 100/100/- | 1.0 | 140 | 90 | 1.320 | 65 | laminate-1 |
| Exam. 2 | 50/100/50 | 1.0 | 140 | 80 | 1.325 | 70 | Laminate-2 |
| Com. Ex. 1 | 150 (PPS-NO) | — | — | — | 1.319 | 8 | PPS-NO-2 |
| Com. Ex. 2 | 150 | — | — | — | 1.352 | 68 | PPS-BO-3 |

TABLE 1-1-continued

| | Structure of Lamination B/A/B' (μ) | Thickness ratio (B+B')/A | PPS-NO crystallization temperature Tcc (°C.) | Rate of Residual crystallization heat (%) | PPS-NO Density (ρ) | Elongation at break (%) | Sample |
|---|---|---|---|---|---|---|---|
| | (PPS-BO) | | | | | | |
| Com. Ex. 3 | 100/100/- | 1.0 | 120 | 18 | 1.347 | 65 | Laminate-3 |
| Com. Ex. 4 | 50/100/50 | 1.0 | 120 | 18 | 1.348 | 70 | Laminate-4 |
| Com. Ex. 5 | 50/100/50 | 1.0 | 140 | 15 | 1.348 | 60 | Laminate-5 |
| Com. Ex. 6 | 50/100/50 | 1.0 | 120 | 0 | 1.350 | 65 | Laminate-6 |
| Exam. 3 | 100/100/- | 1.0 | 137 | 85 | 1.324 | 68 | Laminate-7 |
| Exam. 4 | 100/100/100 | 1.0 | 137 | 87 | 1.322 | 70 | Laminate-8 |

TABLE 1-2

| | Heat resistance | Impact resistance | Heat resistance for high temperature | wet heat resistance | Flame resistance | Adhesive force (g/cm) | Tear strength (g/mm) | Sample |
|---|---|---|---|---|---|---|---|---|
| Exam. 1 | ○ | ○ | ○ | ○ | ○ | ≧900 | 1,000 | laminate-1 |
| Exam. 2 | ○ | ○ | ○ | ○ | ○ | ≧900 | 970 | Laminate-2 |
| Com. Ex. 1 | Δ | ○ | X | ○ | ○ | — | 1,200 | PPS-NO-2 |
| Com. Ex. 2 | ○ | X | ○ | ○ | ○ | — | 250 | PPS-BO-3 |
| Com. Ex. 3 | ○ | Δ | ○ | ○ | ○ | 600 | 600 | Laminate-3 |
| Com. Ex. 4 | ○ | Δ | ○ | ○ | ○ | 500 | 500 | Laminate-4 |
| Com. Ex. 5 | ○ | X~Δ | ○ | ○ | ○ | 300 | 400 | Laminate-5 |
| Com. Ex. 6 | ○ | X | ○ | ○ | ○ | 180 | 300 | Laminate-6 |
| Exam. 3 | ○ | ○ | ○ | ○ | ○ | ≧900 | 1,000 | Laminate-7 |
| Exam. 4 | ○ | ○ | ○ | ○ | ○ | ≧900 | 950 | Laminate-8 |

EXAMPLES 5 TO 8, COMPARATIVE EXAMPLES 7 AND 8

Three-layer laminates having the thickness ratios shown in Table 2 were made in the manner similar to that of Example 1. The films of PPS-BO used were all "Torelina" of corona treated type produced by Toray Industries' Inc. The results of estimation of these laminates are shown in Table 2. When the thickness ratio of (B+B')/A decreases, the elongation at break and heat resistance for high temperature of the laminate are apt to decrease. On the contrary, when the thickness ratio increases, the tear strength and impact resistance of the laminate are apt to decrease.

COMPARATIVE EXAMPLES 9 AND 10

"Laminate-9" was obtained by using PPS-NO-3 and PPS-BO of type 3030 having a thickness of 25 μm and heat bonding and cooling under the codition of Comparative Example 6 in order to compare with Example 6 (Comparative Example 9).

To compare with Example 7, PPS-BO-2 was made and PPS-NO having a thickness of 900 μm was made under the codition of Example 1, the films were laminated to a three-layer laminate having a lamination structure of PPS-BO-2/PPS-NO/PPS-BO-2 and heat bonded, and the laminate was forcibly cooled by fresh air in a manner similar to that of Example 1. However, the laminate was not cooled to the crystallization temperature within 60 seconds (Comparative Example 10).

From the results shown in Table 2, it is understood that, if the crystallization temperature of PPS-NO used is low or the rate of residual crystallization heat of a laminate is low even in a laminate whose thickness ratio is chnged, the adhesive property or the tear strength of the laminate decreases. Further, if a PPS-NO is too thick or a laminate is too thick, cooling by air becomes insufficient, the PPS-NO is crystallized and the tear strength and impact resistance of the laminate decrease. In the laminate according to the present invention, the tear strength and impact resistance of the laminate can be improved without decreasing the characteristics of PPS-BO such as heat resistance.

TABLE 2

| | Structure of Lamination B/A/B' (μ) | Thickness ratio (B+B')/A | PPS-NO crystallization temperature Tcc (°C.) | Rate of Residual crystallization heat (%) | PPS-NO Density (ρ) | Elongation at break (%) | Impact resistance | Heat resistance for high temperature | Tear strength (g/mm) | Sample |
|---|---|---|---|---|---|---|---|---|---|---|
| Exam. 5 | 10/100/10 | 0.2 | 140 | 86 | 1.322 | 40 | ○ | Δ~○ | 1,000 | |
| Exam. 6 | 25/100/25 | 0.5 | 140 | 84 | 1.325 | 65 | ○ | ○ | 1,000 | |
| Exam. 2 | 50/100/50 | 1.0 | 140 | 80 | 1.325 | 70 | ○ | ○ | 970 | Laminate-2 |
| Exam. 7 | 100/100/100 | 2.0 | 138 | 82 | 1.328 | 60 | ○ | ○ | 900 | |
| Exam. 8 | 125/50/125 | 5.0 | 140 | 88 | 1.330 | 68 | Δ~○ | ○ | 700 | |
| Com. Ex. 7 | 6/120/6 | 0.1 | 138 | 86 | 1.320 | 20 | ○ | X~Δ | 1,100 | |
| Com. Ex. 8 | 125/25/125 | 10 | 138 | 90 | 1.324 | 70 | X~Δ | ○ | 400 | |
| Com. Ex. 9 | 25/100/25 | 1.5 | 120 | 0 | 1.348 | 55 | X | ○ | 300 | Laminate-9 |
| Com. Ex. 10 | 100/900/100 | 0.22 | 138 | 15 | 1.348 | 40 | X | ○ | 400 | Laminate-10 |

Although several preferred embodiments of the present invention have been described herein in detail, it will be appreciated by those skilled in the art that various modifications and alterations can be made to these embodiments without materially departing from the novel teachings and advantages of this invention. Accordingly, it is to be understood that all such modifications and alterations are included within the scope of the invention as defined by the following claims.

What is claimed is:

1. A process for producing a laminate comprising the steps of:
   laminating a biaxially oriented polyphenylenesulfide film on at least one surface of a non-oriented polyphenylenesulfide film;
   bonding the laminated films by thermocompression bonding at a temperature in the range of 180° to 270° C. and a pressure in the range of 1 to 20 kg/cm$^2$; and
   cooling the bonded films to a temperature not higher than the crystallization temperature of said non-oriented polyphenylenesulfide film within 60 seconds.

2. The process according to claim 1 further comprising the step of heat fixing the laminated films in advance at a temperature in the range of 80° to 130° C. and a pressure in the range of 1 to 20 kg/cm$^2$ between said laminating step and said bonding step.

3. The process according to claim 1, wherein said biaxially oriented polyphenylenesulfide film and said non-oriented polyphenylenesulfide film are laminated by melt extruding a non-oriented polyphenylenesulfide on said biaxially oriented polyphenylenesulfide film in the form of a sheet.

4. The process according to claim 1, wherein said biaxially oriented polyphenylenesulfide film is laminated on a surface of said non-oriented polyphenylenesulfide film, the laminated films are bonded by thermocompression bonding at a temperature in the range of 180° to 270° C. and a pressure in the range of 1 to 20 kg/cm$^2$, the bonded films are cooled to a temperature not higher than the crystallization temperature of said non-oriented polyphenylenesulfide film within 60 seconds, and thereafter, another biaxially oriented polyphenylenesulfide film is further laminated on another surface of said non-oriented polyphenylenesulfide film and bonded by thermocompression bonding at a temperature in the range of 180° to 270° C. and a pressure in the range of 1 to 20 kg/cm$^2$, and wherein the resulting bonded films are cooled to a temperature not higher than the crystallization temperature of said non-oriented polyphenylenesulfide film within 60 seconds.

5. The process according to claim 4, wherein said biaxially oriented polyphenylenesulfide film and said non-oriented polyphenylenesulfide film are laminated by melt extruding non-oriented polyphenylenesulfide on said biaxially oriented polyphenylenesulfide film in the form of a sheet.

6. The process according to claim 1, wherein a biaxially oriented polyphenylenesulfide film, a non-oriented polyphenylenesulfide film and another biaxially oriented polyphenylenesulfide film are laminated in this order substantially simultaneously, the laminated films are bonded by thermocompression bonding under said temperature in the range of 180° to 270° C. and a pressure in the range of 1 to 20 kg/cm$^2$, and the bonded films are cooled to a temperature not higher than the crystallization temperature of said non-oriented polyphenylenesulfide film within 60 seconds.

7. The process according to claim 6, wherein said biaxially oriented polyphenylenesulfide films and said non-oriented polyphenylenesulfide film are laminated by melt extruding a non-oriented polyphenylenesulfide between said biaxially oriented polyphenylenesulfide films in the form of a sheet.

8. The process according to claim 1, wherein said cooling temperature is not higher than 80° C.

9. The process according to claim 1, wherein a non-oriented polyphenylenesulfide film, whose exothermic peak determined by a differential scanning calorimeter when the film is heated from 20° C. to 180° C. in an inert gas atmosphere is not less than 125° C., is used as said non-oriented polyphenylenesulfide film.

* * * * *